(12) United States Patent
Sun

(10) Patent No.: US 6,350,672 B1
(45) Date of Patent: Feb. 26, 2002

(54) INTERCONNECT STRUCTURE WITH GAS DIELECTRIC COMPATIBLE WITH UNLANDED VIAS

(75) Inventor: Shih-Wei Sun, Taipei (TW)

(73) Assignee: United Microelectronics Corp., Hsin Chu (TW)

( * ) Notice: Subject to any disclaimer, the term of this patent is extended or adjusted under 35 U.S.C. 154(b) by 0 days.

(21) Appl. No.: 08/948,368

(22) Filed: Oct. 9, 1997

Related U.S. Application Data

(60) Provisional application No. 60/053,914, filed on Jul. 28, 1997.

(51) Int. Cl.$^7$ ............ H01L 21/4763; H01L 21/31
(52) U.S. Cl. ............ 438/619; 438/622; 438/623; 438/787; 438/637
(58) Field of Search ............ 438/622, 623, 438/27, 701, 619, 758, 692, 787, 674, 637

(56) References Cited

U.S. PATENT DOCUMENTS

| | | | |
|---|---|---|---|
| 4,722,913 A | * | 2/1988 | Miller ............ 437/196 |
| 5,017,403 A | * | 5/1991 | Pang et al. ............ 427/39 |
| 6,020,258 A | * | 2/2000 | Yew et al. ............ 438/634 |
| 6,043,145 A | * | 3/2000 | Suzuki et al. ............ 438/622 |

OTHER PUBLICATIONS

M.B. Anand, et al., "NURA: A Feasible, Gas–Dielectric Interconnect Process," 1996 Symposium on VLSI Technology Digest of Technical Papers, 1996, pp.82–83.

M.B. Anand et al. "NURA: A Feasible, Gas–Dielectric Interconnect Process", 1996 Symposium on VLSI Technology Digest of Technical Papers, 1996, pp.82–83.*

* cited by examiner

*Primary Examiner*—John F. Niebling
*Assistant Examiner*—Viktor Simkovic
(74) *Attorney, Agent, or Firm*—Rabin & Champagne

(57) ABSTRACT

A multilevel interconnect structure is formed which uses air as a dielectric between wiring lines and which is compatible with the presence of unlanded vias in the interconnect structure. A layer of carbon is deposited over an insulating surface and then a pattern for trenches is formed in the surface of the layer of carbon. Metal is deposited in the trenches and over the layer of carbon and then a chemical mechanical polishing process is used to define wiring lines. An ashing or etch back process is performed on the carbon layer to recess its surface below the surfaces of the wiring lines. An oxide capping layer is provided over the recessed surface of the carbon and the wiring lines, for example using HSQ and curing, and then the carbon layer is consumed through the capping layer using an oxidation process. Air replaces the sacrificial carbon layer during the consumption reaction. Next, a silicon nitride etch stop layer is provided over the surface of the capping layer and then an intermetal dielectric layer is provided. A via is formed by etching through the intermetal dielectric, stopping on the etch stop layer, and then etching through the etch stop layer and the capping layer in distinct processes. The via is filled with a metal plug and then second level wiring lines are formed.

42 Claims, 5 Drawing Sheets

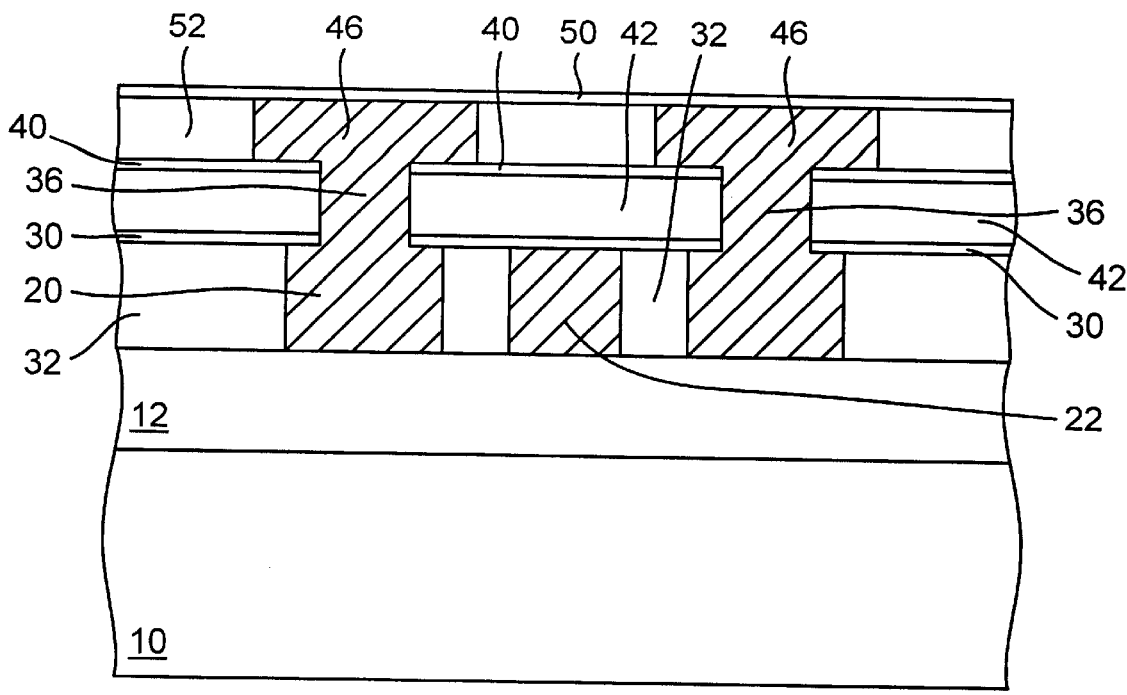
FIG. 1 - PRIOR ART
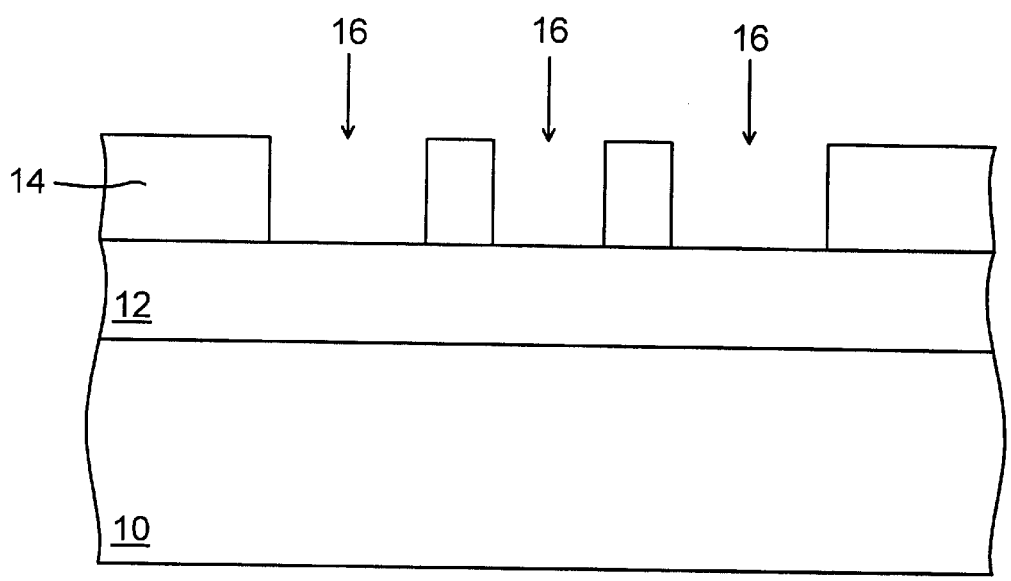
FIG. 2 - PRIOR ART

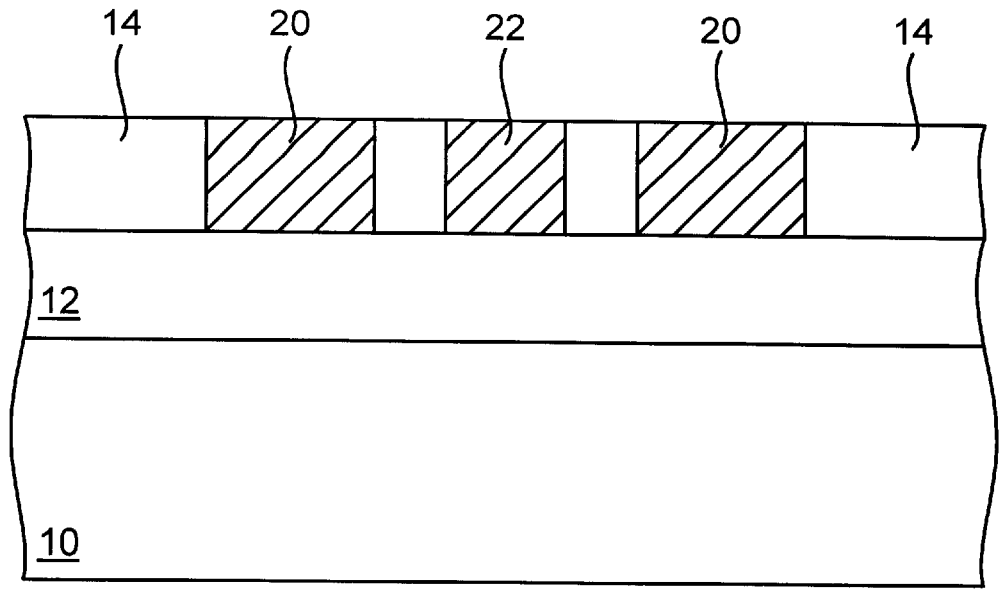
FIG. 3 - PRIOR ART
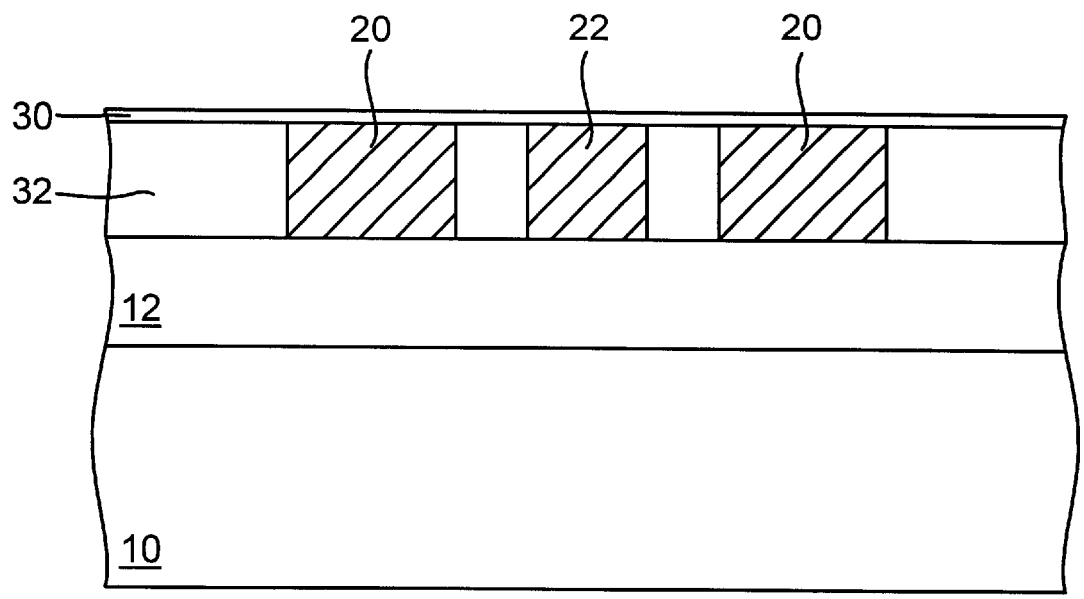
FIG. 4 - PRIOR ART

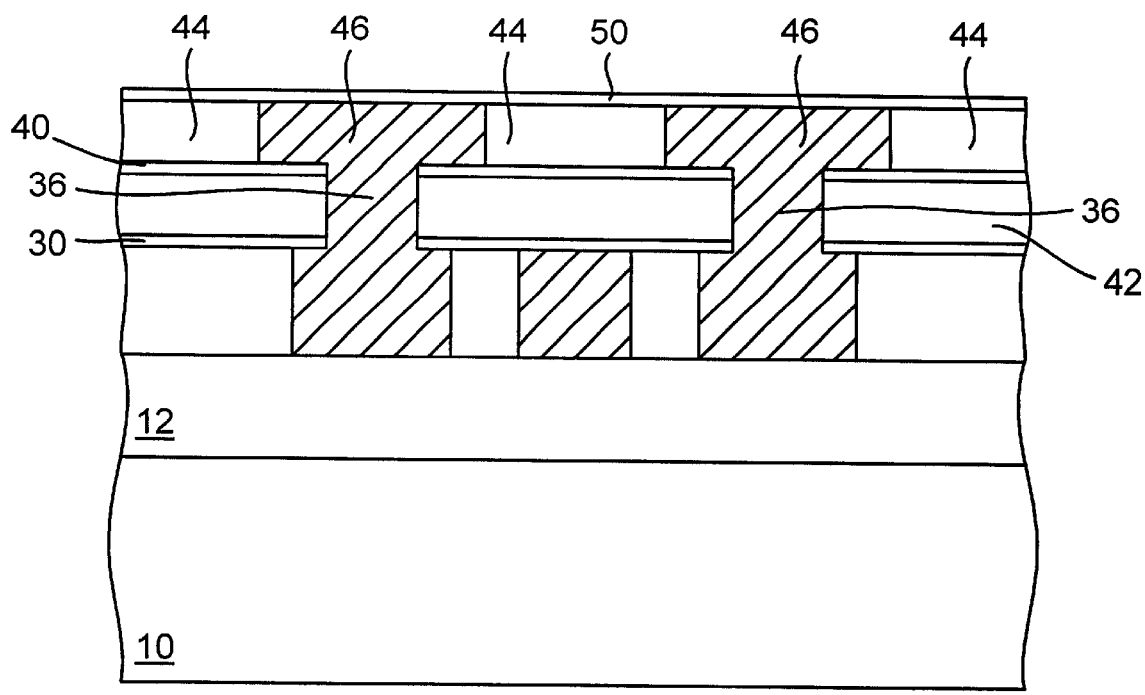
FIG. 5 - PRIOR ART
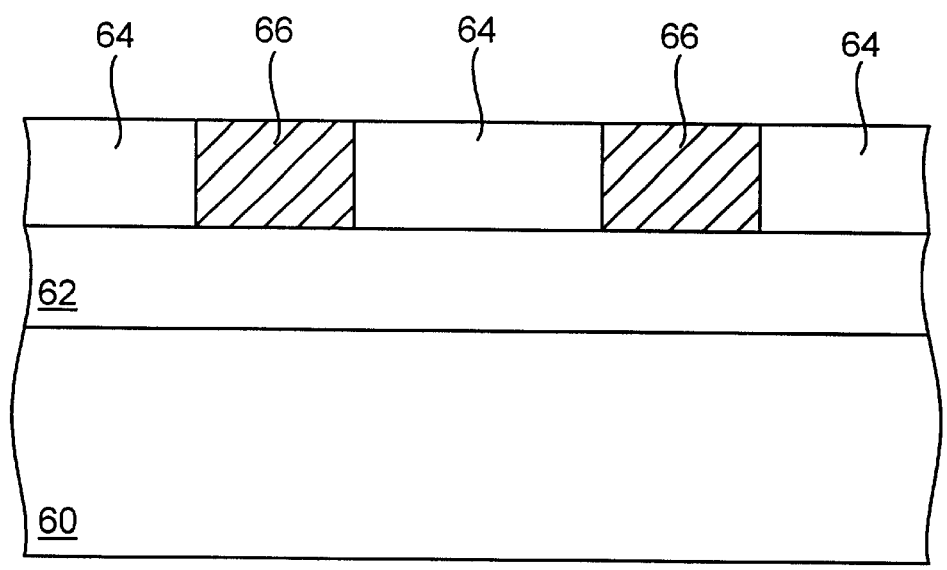
FIG. 6

INTERCONNECT STRUCTURE WITH GAS DIELECTRIC COMPATIBLE WITH UNLANDED VIAS

This application claims priority from provisional application Serial No. 60/053,914, filed Jul. 28, 1997.

BACKGROUND OF THE INVENTION

1. Field of the Invention

The present invention relates to the formation of integrated circuit devices of the type that include multilevel interconnect structures.

2. Description of the Related Art

Modern integrated circuits include devices such as field effect transistors (FETs) or bipolar devices formed in and on a semiconductor substrate in combination with a multilevel interconnect structure formed above and in contact with the devices. The multilevel interconnect structure provides connections to and between different ones of the devices formed in the substrate and so is an increasingly important aspect of aggressive designs for integrated circuits. In many integrated circuits, the multilevel interconnect structure includes one or more arrays of wiring lines extending in parallel to provide connections to and between the devices in closely packed arrays of devices. Such arrays of devices are typical of integrated circuit memories and other aggressive circuit designs. Closely spaced, parallel wiring lines can provide undesirable levels of capacitive and inductive coupling between adjacent wiring lines, particularly for higher data transmission rates through the arrays of parallel wiring lines. Such capacitive and inductive coupling slow data transmission rates and increase energy consumption in a manner that can limit the performance of the integrated circuits. For some aggressive circuit designs, the delays and energy consumption associated with the circuit's interconnect structure are a significant limitation on the circuit's performance.

The complexity of modern interconnect structures has become a major cost component for integrated circuit designs. Various factors threaten to further increase the proportional expense of the interconnect structure within integrated circuits. For example, proposals have been advanced for substituting different interlayer and intermetal dielectric materials into multilevel interconnect structures to improve the coupling problem. The capacitive and inductive coupling between adjacent wiring lines is mediated by the dielectric material that separates the wiring lines. Present dielectric materials, such as silicon oxides deposited by chemical vapor deposition (CVD) from TEOS source gases, have comparatively high dielectric constants, and proposals have been made to replace these dielectric materials with dielectric materials having lower dielectric constants. Performance could be improved by replacing the higher dielectric constant materials with lower dielectric constant materials, with the theoretical minimum dielectric constant being provided by a gas or vacuum dielectric. Adoption of these alternate dielectric materials has not been completely satisfactory to this point in time, due to the increased cost and processing difficulty associated with these alternative materials.

One promising implementation of a multilevel interconnect structure using an air dielectric is described in the article by Anand, et al., NURA: A Feasible, Gas-Dielectric Interconnect Process, 1996 *Symposium on VLSI Technology, Digest of Technical Papers*, 82–83 (1996). The interconnect structure and a method for making that structure are illustrated in FIGS. 1–5. The completed wiring structure is schematically illustrated in FIG. 1, which shows a substrate 10 having various devices (not shown) formed on its surface and covered by an interlayer dielectric 12. First level wiring lines 20, 22 extend along the surface of the interlayer dielectric 12 and are separated by air gaps 32. The use of air gaps, as compared to more conventional dielectric materials, ensures that there is a minimal level of coupling between the adjacent first level wiring lines 20, 22. The first level air gaps are bounded on the bottom by the interlayer dielectric 12 and on the top by a thin layer of silicon oxide 30. Contacts to the first level wiring lines 20 include vertical interconnects 36 that extend from the first level wiring lines 22 to the second level wiring lines 46. The first level wiring lines 22 and the second level wiring lines 46 are separated vertically by via level air gaps 42 that surround the vertical interconnects 36 and which are bounded on the bottom and top by thin layers of silicon oxide 30 and 40, respectively. These via level air gaps reduce the extent of capacitive and inductive coupling between the first level wiring lines 20, 22 and the second level wiring lines 46, as compared to more conventional solid dielectric materials. In a similar fashion, second level air gaps 52, bounded on top and bottom by thin layers of silicon oxide 50, 40, are provided between the second level wiring lines 46 to reduce the level of capacitive and inductive coupling between the second wiring lines.

The device illustrated in FIG. 1 is significant in that it reduces some of the problems with signal delays and energy dissipation associated with the multilevel interconnect structures used in high density integrated circuit designs. The methods used to manufacture the device shown in FIG. 1 are also significant and are now described with reference to FIGS. 2–5. Referring first to FIG. 2, devices are formed in the desired configuration in and on the substrate 10 and then the substrate is covered with an interlayer dielectric 12. Vias may be formed through the interlayer dielectric 12 to provide connections to the device formed in the substrate (not shown) and the first level wiring lines may be formed in a manner that fills those vias or so that the first level wiring lines will make contact with the interconnects that fill those vias. First level wiring lines are formed in a modified damascene process. First, a layer of carbon is deposited over the surface of the interlayer dielectric and then a mask (not shown) is provided on the surface of the carbon layer 14, typically using photolithography to form a photoresist mask. The photoresist mask exposes the surface of the carbon layer 14 in a pattern corresponding to the arrangement desired for the first level wiring lines. Anisotropic etching is performed to provide trenches 16 in the carbon layer 14 and the mask is removed to provide the structure shown in FIG. 2.

Metal is then deposited over the FIG. 2 structure and then the excess metal is removed to define first level wiring lines 20, 22, as shown in FIG. 3. Next, a thin layer of silicon oxide 30 is provided over the first level wiring lines 20, 22 and the remaining portions of the carbon layer 14. Preferably, the thin silicon oxide layer 30 is deposited by sputtering to a thickness of approximately 500 Å. Next, the device is placed in a furnace holding an oxygen ambient and heated to a temperature of 400–450° C. for approximately two hours. In this environment, oxygen readily diffuses through the thin oxide layer 30 to react with the carbon layer 14, forming $CO_2$ which diffuses back through the thin oxide layer and escapes. After the two hour ashing period, the entire carbon layer 14 is consumed, leaving behind air gaps 32 between the oxide layer 30 and the interlayer dielectric 12 and separating the first level wiring lines 20, 22, as shown in FIG. 4. This process can then be repeated to produce the multilevel interconnect structure shown in FIG. 5. Thus, a via level of carbon is deposited and patterned to define the vias through which vertical interconnects are to be formed. The oxide within the vias is removed, metal is deposited and etched back to provide the vertical interconnects within the via level carbon layer, and then a thin layer of oxide 40 is deposited over the carbon layer. Ashing is performed to remove the oxide layer, leaving via level air gaps 42 between the vertical interconnects 36 and between the oxide layers 30, 40. A second level of carbon 44 is deposited and patterned to define second level wiring line trenches, the oxide layer 40 is removed as appropriate over the vertical interconnects 36, and the trenches are filled to define second level wiring lines 46 in contact with the first level wiring lines through the vertical interconnects. As before, a layer of silicon oxide 50 (FIG. 5) is provided by sputtering over the carbon layer 44 and an ashing process is performed to provide air gaps 52 between the second level wiring lines, completing the structure illustrated in FIG. 1.

The method of forming the structure illustrated in FIG. 1 is simple and is a reliable process, at least when simplicity and reliability are measured against the other methods that are known for producing interconnect structures that use air as the dielectric material separating adjacent wiring lines. There are, however, aspects of the process described above for forming the FIG. 1 structure which are incompatible with certain manufacturing processes. It is thus desirable to provide a method of forming a multilevel interconnect structure that is compatible with other considerations of importance to high density integrated circuit devices.

SUMMARY OF THE PREFERRED EMBODIMENTS

According to one aspect, the present invention forms an integrated circuit device by providing a pattern of wiring lines over an insulating layer, a first wiring line laterally separated from a second wiring line by a layer of sacrificial material. A portion of the layer of sacrificial material is removed to recess an upper surface of the layer of sacrificial material below upper surfaces of the first and second wiring lines. A layer of capping material is provided over the first and second wiring lines and over the recessed upper surface of the layer of sacrificial material. Then, a consumption reaction is performed through the layer of capping material to consume at least a further portion of the layer of sacrificial material, leaving an air dielectric between the first and second wiring lines bounded on an upper surface by the capping layer.

According to another aspect, the present invention forms an integrated circuit device by providing a pattern of wiring lines over an insulating layer, individual wiring lines laterally separated by sacrificial material. A capping layer is provided over the pattern of wiring lines and over an upper surface of the sacrificial material. A consumption reaction is performed through the capping layer to consume at least a portion of the sacrificial material, leaving an air dielectric in place of the consumed sacrificial material. An etch stop layer is provided over the capping layer after the consumption reaction and an intermetal dielectric layer is provided over the etch stop layer, the intermetal dielectric layer having a different composition than the etch stop layer. A via is formed by etching through the intermetal dielectric layer, stopping on the etch stop layer, etching through the etch stop layer and etching through the capping layer.

BRIEF DESCRIPTION OF THE DRAWINGS

FIG. 1 illustrates a conventional multilevel interconnect structure that incorporates air gaps as the dielectric material separating adjacent wiring lines.

FIGS. 2–5 illustrate a method for forming the multilevel interconnect structure of FIG. 1.

FIGS. 6–9 illustrate a method for forming a multilevel interconnect structure in accordance with a preferred embodiment of the present invention.

DETAILED DESCRIPTION OF THE PREFERRED EMBODIMENTS

Figure 7:
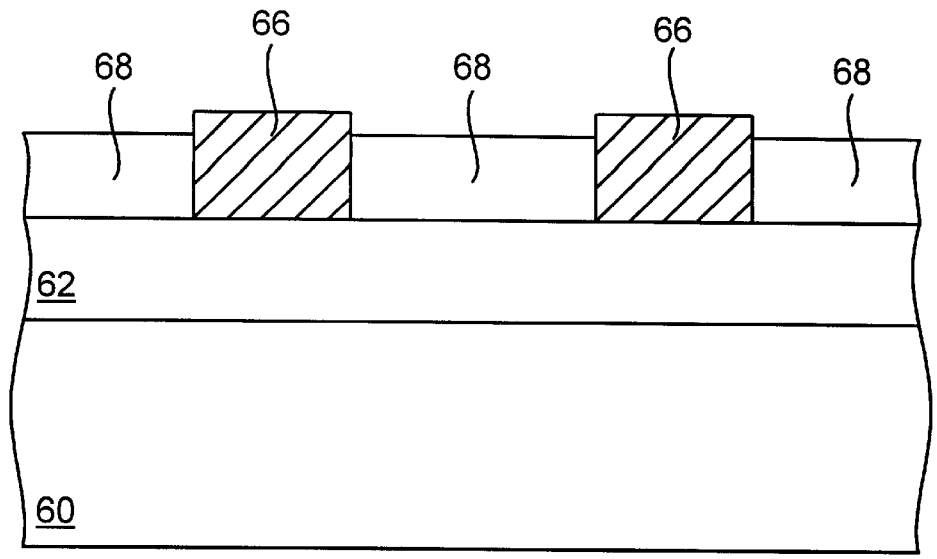
Figure 8:
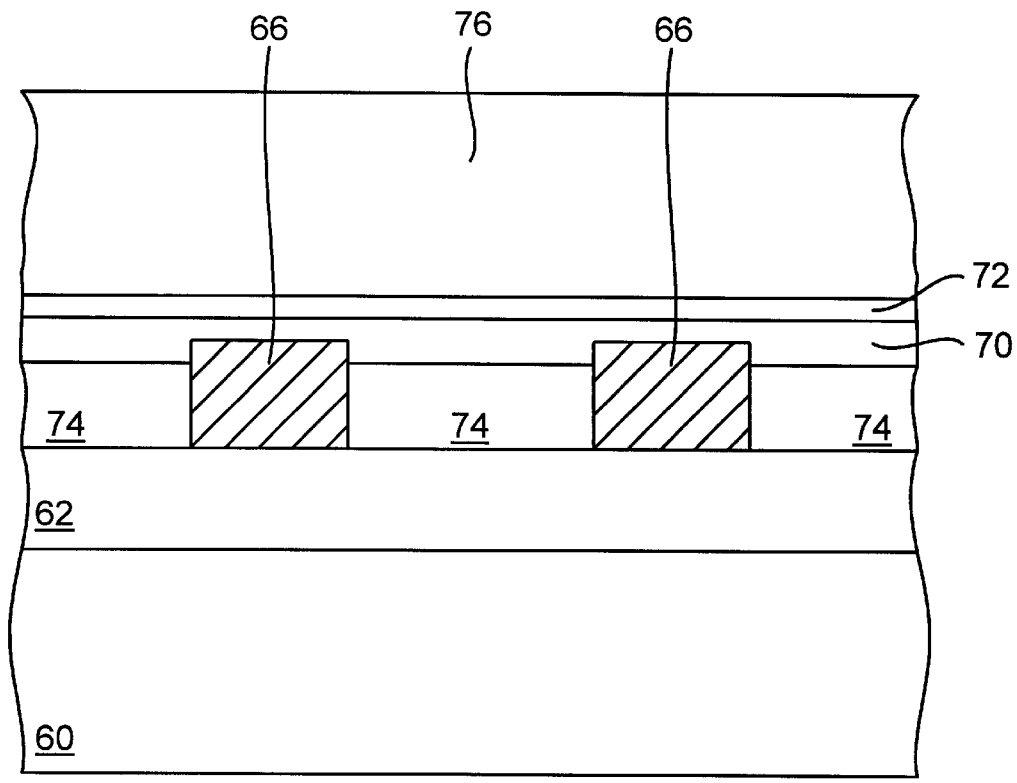
Figure 9:
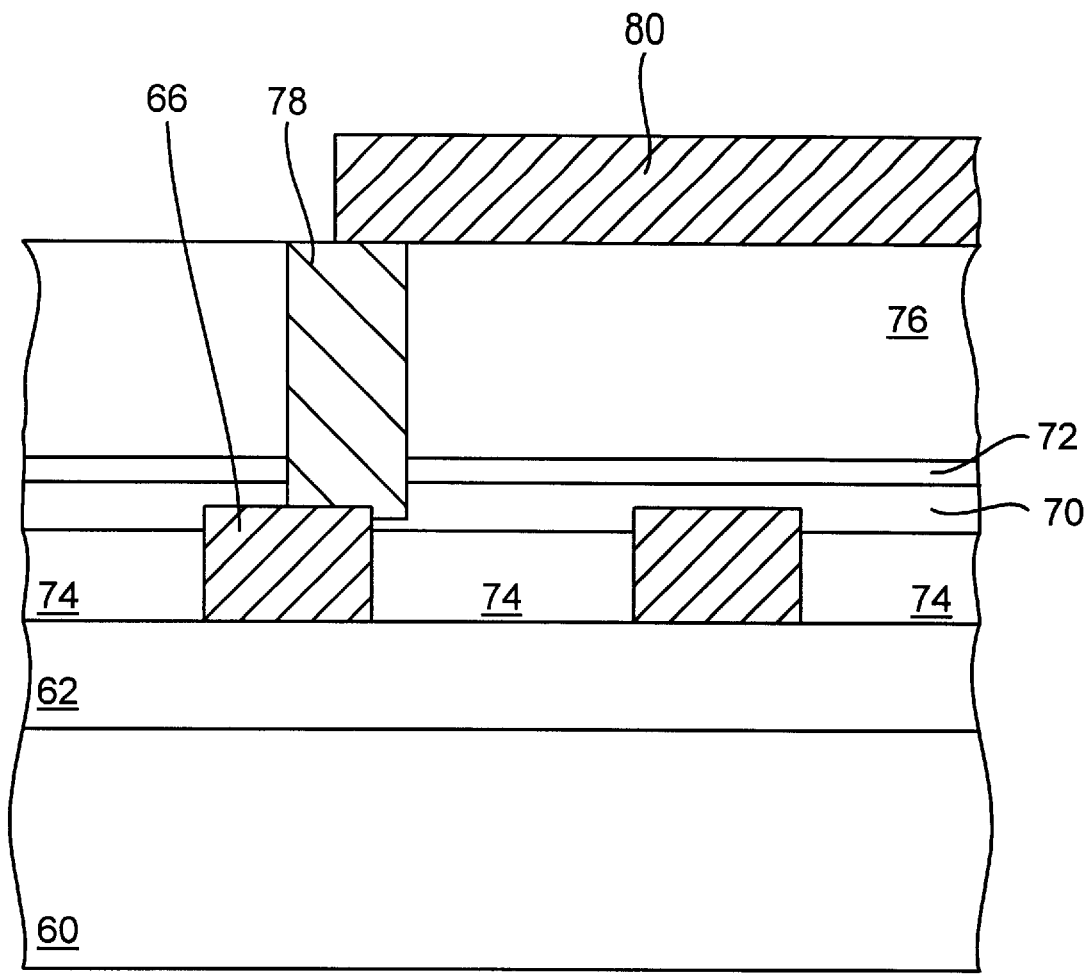

The conventional multilevel interconnect structure illustrated in FIG. 1 provides air gaps as the dielectric material separating the wiring lines and other conductors within the multilevel interconnect structure. For example, air gaps 32 are provided as the insulation between first level wiring lines 20, 22. The low dielectric constant ($k \approx 1$) of air provides an improvement of a factor of 2–4 over interconnect structures that use solid dielectric materials. The FIG. 1 structure accordingly has significant advantages with respect to reducing the capacitive and inductive coupling between adjacent wiring lines in the wiring required by a high density integrated circuit. Because the capacitive and inductive coupling of the FIG. 1 structure are reduced as compared to conventional interconnect structures, the operating speed and power consumption of high density integrated circuits which incorporate aspects of the FIG. 1 interconnect structure are improved. There is, however, an important aspect of the conventional FIG. 1 interconnect structure that hinders its application to such high density integrated circuits. In particular, the FIG. 1 structure is incompatible with the formation of unlanded vias, which are often a feature of high density integrated circuit designs.

The conventional FIG. 1 structure facilitates the formation of vertical interconnects between different levels of wiring lines by enlarging the wiring lines in the region where the vertical interconnects are to be formed. This enlarged "landing pad" area can be seen in FIG. 1 by comparing the larger width of the sections 20 of the first level wiring lines where interconnects 36 are formed with the sections 22 of the first level wiring lines not associated with an interconnect. Such a landing pad area for the first level wiring lines provides a margin for possible errors in alignment and in the lithography process used to define the interconnects 36. If, for the FIG. 1 structure, enlarged sections of the first level wiring lines were not provided, then the vertical interconnects 36 and the first level wiring lines 22 beneath the vertical interconnects would be the same size. Any misalignments or other lithography errors would then cause the etching used to define the vias to remove the first oxide layer 30 from above the air gaps 32, possibly allowing the oxide layer 30 to collapse over the affected air gap 32. Subsequent cleaning processes could leave contaminants within the affected air gap in a manner that could foul any subsequently formed interconnects. Subsequent metal deposition processes could expand the first level wiring lines in an undesired manner or could even introduce a short across the first level wiring lines. As such, the FIG. 1 structure and the methods used in forming the FIG. 1 structure are not compatible with the formation of unlanded vias.

As the design rules for integrated circuits shrink, it becomes increasingly undesirable to provide oversized landing pad areas within lower level wiring lines to accommodate the misalignments or lithography errors that lead to the formation of unlanded vias. Such oversized sections preclude the associated wiring lines from being spaced as closely as is possible for the design rule applicable to the given process. To fully utilize the advantages of the smaller design rules, it is desirable to use both vias and wiring lines comparable in size to the design rule. Such a design choice necessarily means that unlanded vias will be formed in the course of forming the interconnect structure. Preferred embodiments of the present invention provide a method of forming a multilevel interconnect structure that incorporates air gaps as the dielectric material between adjacent wiring lines and which is compatible with designs that produce unlanded vias. In particular, some preferred embodiments of the present invention deposit a layer of carbon, form trenches and fill the trenches with metal wiring lines, deposit a layer of silicon oxide over the metal wiring lines and the carbon layer and then perform ashing to remove the carbon layer from between the wiring lines to form air gaps. An etch stop layer is preferably provided over the oxide layer and the metal wiring lines before forming further layers such as an intermetal insulating layer over the wiring line structures. By providing an etch stop layer over the first oxide layer, vias can be reliably formed through a thick intermetal insulating layer to the first oxide layer, whether that intermetal insulating layer be carbon, oxide or another dielectric material, with a far reduced likelihood of the via etch process opening onto an air gap in an unlanded portion of the via. As such, methods in accordance with the present invention have improved compatibility with the processes that are most desirably used for formation of high density integrated circuit devices.

These and other aspects of the present invention will now be described in further detail with reference to FIGS. 6–9. Referring to FIG. 6, formation of the multilevel interconnect structure according to the present invention begins in a fashion similar to that discussed above for the formation of the FIG. 1 interconnect structure. Thus, a semiconductor substrate 60 having a variety of devices formed in and on its surface is provided and the substrate and the various devices are covered by an interlayer dielectric 62. The interlayer dielectric 62 is typically an oxide of silicon, but may take several forms including, for example, a single layer of CVD silicon oxide or a combination of oxide layers and spin on glass (SOG) layers. Vias are provided through the layer 62 as appropriate and metal or polysilicon interconnects are provided either in a separate process or as part of the process for forming the first level wiring lines. The interlayer dielectric 62 is then covered with a layer of carbon deposited, for example, in a high density plasma CVD (HDPCVD) process using a $CH_4$ or $C_2H_2$ source gas. An appropriate system for performing this deposition is available commercially from Applied Materials Corporation of Santa Clara, Calif., and so is not described further herein. The carbon layer 64 is deposited to a thickness appropriate to first level metal wiring lines, for example, between approximately 5,000–12,000 Å. A photoresist mask or, more preferably, a hard mask consisting of either silicon oxide or silicon nitride is provided over the carbon layer 64, exposing the carbon layer 64 over those regions where first level wiring lines are to be formed. Anisotropic etching is performed to form trenches into the carbon layer 64 and the etch mask is removed. Metal is then deposited over the carbon layer and within the trenches in the carbon layer 64. The metal used for the first level wring lines might be aluminum or a refractory metal or a multilayer combination of such metals or different conductive materials. It is preferred that the first level wiring lines and other conductors that are separated by air gaps formed by the removal of carbon be capable of withstanding an ashing process at a temperature of between 400–450° C. Either an etch back process or, more preferably, a chemical mechanical polishing (CMP) process is used to remove excess metal from the surface of the carbon layer 64, defining the first level wiring lines 66 shown in FIG. 6. As illustrated, the upper surfaces of the wiring lines 66 are preferably coplanar with the surfaces of the carbon layer 64, which is most easily achieved using CMP.

Next, recesses are preferably formed in the carbon layer 64 by providing the FIG. 6 structure to an ashing or etching system and exposing the carbon layer 64 to an oxygen plasma ashing or etching process. This will produce recessed carbon regions 68 with surfaces spaced from the upper surfaces of first level wiring lines 66 by a few hundred angstroms. The resulting structure is shown in FIG. 7. Next, an oxide layer 70 is deposited over the recessed carbon structures 68 and the first level wiring lines 66 so that the oxide layer extends partially down the sides of each of the first level wiring lines 66. The oxide layer 70 serves different purposes in the structure and processes of the present invention. Forming the oxide layer to extend partially along the walls of the metal lines provides additional process latitude for future etching processes used to expose and to contact the surface of the first level wiring lines. As such, the oxide layer facilitates the formation of unlanded vias. A consumption reaction, which consists primarily of oxidation in the illustrated embodiment, is preferably performed through the oxide layer 70 to consume the sacrificial carbon layer 68 to create the air gaps 74 between the illustrated first level wiring lines 66. After the air gaps are defined, the oxide layer 70 defines the upper extent of the air gaps 74 and supports any subsequently deposited layers. The oxide layer 70 is preferably formed to a thickness appropriate to the preferred ashing process while still being sufficiently thick to provide a reasonable level of structural support for later deposited layers. As discussed in the Anand article, an appropriate oxide layer might be about 500 Å in thickness. A particularly preferred method for forming the oxide capping layer 70 is by the deposition of a liquid polymer material that is cured to form a planarized oxide layer. For example, the material known as "HSQ" (hydrogen silsesquioxane) may be provided in its liquid form over the FIG. 7 structure and then the HSQ can be annealed at a temperature of approximately 400° C. for approximately 90 minutes in a nitrogen environment to form the oxide layer 70 (nominally $SiO_{3/2}$). The preferred method of forming the oxide layer 70 by spinning on liquid HSQ and curing the HSQ has the particular advantage of automatically providing a planarized surface for the oxide layer 70. This is so because a spin on process is used to provide the liquid polymer HSQ to the surface before curing. Other polymeric or other liquids that can be deposited and cured or otherwise solidified to form a layer of dielectric material might be used in place of the illustrative HSQ material. The liquid used in forming the capping layer might be selected so that a chemical reaction or a process such as the deposition of material from a saturated solvent occurs in or from the liquid to provide material to form the oxide layer or an equivalent capping layer. If layer 70 is formed by a process which does not naturally produce a planarized surface for the oxide layer, such as by a CVD or HDPCVD process, then it is preferred that a planarization process be performed so that layer 70 is provided with a substantially planar surface. For example, if a CVD oxide is used, it is preferred that the CVD oxide be planarized using CMP before further processing because planarized surface provides much wider process margins for later via etch steps.

An ashing process is performed to remove the carbon layer 68 from beneath the oxide layer. For example, the ashing process might be performed in an oxygen ambient at a temperature of about 400–450° C. for a sufficiently long time to completely consume the thickness of the carbon layer through the oxide layer, approximately one to two hours. At the end of this process, the first level wiring lines 66 are separated by air gaps 74 that are bounded on the upper surface by capping oxide layer 70 and on the lower surface by interlayer dielectric 62. The air gaps form the dielectric isolation between the first level wiring lines and so ensure a relatively low level of capacitive and inductive coupling between adjacent ones of the first level wiring lines 66. In this particularly preferred embodiment, carbon is the sacrificial material that is consumed by the preferred oxidation reaction conducted through the preferred oxide capping layer. The oxide layer has the desired properties of a capping layer in accordance with the present invention in that the preferred oxidation consumption reaction readily proceeds through the oxide capping layer without overly attacking the oxide capping layer. Other systems of sacrificial materials, capping layers and consumption reaction are possible, and aspects of the present invention would also be applicable to such other systems.

Within the present context, the terms capping layer, sacrificial layer and consumption reaction are defined with reference to each other. More explicitly, in terms of the present invention, a consumption reaction or process is one that can remove a sacrificial layer by performing some form of reaction or process through the capping layer with the end result that the sacrificial layer is removed from beneath the capping layer. Alternate systems could likely be identified which would achieve certain of the advantages of aspects of the present invention. For example, photoresist could be substituted for the preferred carbon sacrificial layer in the illustrative process flow, using a similar oxide capping layer and a similar ashing consumption reaction, to achieve many of the same advantages as are provided by at least some aspects of the present invention. At this time, photoresist is less preferred than carbon primarily because carbon has a lower level of trace metal contamination and because the preferred oxidation or ashing processes more completely convert the carbon to $CO_2$ without other, less volatile reaction by-products. Photoresist might nevertheless be desirable in some instances because there is less carbon to be consumed and the consumption reaction is likely to proceed more quickly.

A layer of an etch stop material 72 (FIG. 8) is next provided over the oxide capping layer 70. Generally, the etch stop layer will be different in composition than the oxide capping layer. Importantly, the etch stop layer is selected to be sufficiently different from the layer, which might be an intermetal dielectric layer, that is deposited over the etch stop layer. In this way, the etch stop layer can act as a stop for a via etching process performed through the intermetal dielectric or other layer. Often, the intermetal dielectric layer is an oxide of silicon and so silicon nitride is an appropriate etch stop material. For such embodiments, the etch stop layer is silicon nitride and may be deposited by CVD to a thickness of approximately 200–500 Å. The thickness of the nitride layer is chosen to be no thicker than necessary to provide an adequate etch stop. Excessive nitride thickness is undesirable because nitride deposits slowly and excess nitride requires unnecessary etching time in those subsequent processes like via etching which require that openings be formed through the etch stop layer 72. It might, in some instances, be possible for the oxide capping layer to serve as an etch stop layer, if the intermetal dielectric layer has a composition significantly different from the oxide capping layer. The intermetal dielectric layer is most often an oxide, however, so it is most often desirable to use a silicon nitride etch stop layer in conjunction with an oxide capping layer. In other words, the intermetal dielectric can be etched in two stages to form the via, where the first stage has more high etching speed, and the second stage near the end of the via higher etching selectivity between oxide and nitride.

After deposition of the etch stop layer 72, additional layers of wiring lines could be formed in a manner similar to that used in forming the first level wiring lines and the separating air gaps 74. In such embodiments, the etch stop layer would be covered by a layer of carbon which would then be patterned for the formation of wiring lines and further processing would proceed in the manner described above. For the purposes of the present discussion, however, the process for forming an intermetal dielectric, a via and vertical interconnect and a second level wiring line described next is sufficient to illustrate the practice and advantages of the present invention. It is nevertheless important to keep in mind that various air gap, carbon or other materials might be included in the intermetal dielectric layer through which vertical interconnects might be formed to connect wiring lines formed on either side of the first and second level wiring lines.

In the illustrated embodiments, an intermetal dielectric layer 76 is deposited over the surface of the etch stop layer 72, for example, by CVD of silicon oxide from a TEOS source gas. A via mask is provided on the intermetal dielectric layer 76, for example, by providing a layer of photoresist which is formed into an etching mask by conventional photolithography. A via is then formed through the intermetal dielectric layer by etching. The via etch might be performed in any of a number of dielectric etchers including the LAM Rainbow system, which is particularly preferred because it allows the user to adjust the level of selectivity of the etching process between oxide and nitride materials. This is advantageous for performing the various stages of the via etch in a single processing system using a continuous series of processing steps while still achieving good process controls. Vias are most preferably etched through the intermetal dielectric layer using an etchant which, at least near the end of the via etch through the intermetal dielectric, is highly selective to etching oxide without quickly etching the nitride etch stop layer.

In some embodiments, a comparatively high speed but less selective etching process might be used in an initial stage of the via etching process, followed by a second etching stage using a more selective and typically slower etching process. For example, the first, higher speed, lower selectivity portion of the via etching process might be performed using an etchant derived in a plasma process from source gases including $CF_4$. The second, lower speed, higher selectivity etching process might use an etchant derived from source gases including $C_2F_6$ or $C_3F_8$. The first portion of the via etching process is used to etch partially through the intermetal dielectric and is discontinued well before the etching process nears the etch stop layer. The via etching process is then continued using the high selectivity via etch, stopping on the etch stop layer. Other appropriate etching systems are known to those of ordinary skill and are commercially available. Providing an etch stop layer and using an appropriate etching system is highly desirable for performing the via etch because the intermetal dielectric layer 76 can have thickness variations and varying etch characteristics that make the results of fixed-time etching processes unpredictable and unreliable. The subsequent etching steps used to complete definition of the via proceed through thinner layers in a manner that allows those steps to be more carefully controlled than is possible or practical in the etch process through the thick intermetal dielectric layer. In addition, the etch stop layer and the capping layer are planarized, so that the etching process to be performed is much more predictable and uniform over the different portions of the wafer than it is for the intermetal dielectric layer.

After the via is defined through the intermetal dielectric layer 76 extending vertically toward the first level metal wiring line 66, the via etch is continued through the etch stop layer 72 and capping layer 70 to reach the surface of the first level wiring line 66. For the preferred nitride etch stop layer 72, the etch stop layer can be removed where exposed within the via using a nitride etchant derived, for example, in a plasma process from an $SF_6$ source gas. A portion of the oxide capping layer 70 is then removed where it is exposed within the interconnect via in a fixed time etching process using a conventional oxide etchant such as those discussed above. This etch through the thin, planarized oxide capping layer 70 can be easily controlled to proceed in a manner that satisfactorily clears the surface of the wiring line 66 yet avoids etching completely through the capping layer 70. This aspect of the present invention relates to the formation in preferred embodiments of a capping layer that extends partially downward along the walls of first level wiring lines, providing a sufficient margin for completion of the via etch process. As discussed above, this feature is formed because the carbon sacrificial layer is etched back or recessed to expose the walls of the first level wiring lines prior to depositing the capping layer.

Processing continues after the via is formed and the surface of the wiring line 66 has been cleared by forming a metal plug 78 to fill the via. The metal plug might be formed from aluminum but is more typically formed from tungsten in a CVD process using $WF_6$ as a source gas. In many instances, plug formation begins by providing a glue or adhesion layer, which might be titanium or titanium nitride, within the via and over the surface of the intermetal dielectric layer 76. Sputtering or CVD processes may be used to form the glue or adhesion layer. Tungsten is then provided in a CVD process to fill the via, and a chemical mechanical polishing (CMP) or etch back process is performed to define the vertical extent of the tungsten plug 78 and to remove excess tungsten from the surface of the intermetal dielectric layer 76. The polishing or etch back process also removes unnecessary portions of the glue layer. Further processing continues to form second level wiring lines such as the wiring line 80 shown in FIG. 9. The second level wiring line might be formed by blanket metal deposition and conventional photolithography or by a damascene process.

The present invention has been described in terms of certain preferred embodiments, but those of ordinary skill in the art will appreciate that variations of and modifications to this process and structure might be made without altering the basic teachings of the present invention. For example, while the present invention has been described in terms of forming a first level wiring line connected to other conductors, the present invention might be implemented in multiple ones or all of the layers of a multilevel interconnect structure. Alternately, the present invention might be implemented for various levels of multilevel wiring structures other than the first level. As such, the present invention is not to be limited to any particular embodiment described, but instead the scope of the invention should be determined from the claims, which follow.

What is claimed:

1. A method of forming an integrated circuit device, the method comprising:

providing a pattern of wiring lines over an insulating layer, a first wiring laterally separated from a second wiring line by a layer of sacrificial material, wherein the layer of sacrificial material comprises carbon;

removing a portion of the layer of sacrificial material to recess an upper surface of the layer of sacrificial material below upper surfaces of the first and second wiring lines;

providing a layer of capping material over the first and second wiring lines and over the recessed upper surface of the layer of sacrificial material, wherein the layer of capping material is a nonporous oxide layer; and performing a consumption reaction through the layer of capping material to consume at least a further portion of the layer of sacrificial material, leaving an air dielectric between the first and second wiring lines bounded on an upper surface by the capping layer, wherein the consumption reaction is an oxidation process.

2. The method of claim 1, wherein the sacrificial material consists essentially of carbon.

3. The method of claim 2, wherein the consumption reaction continues to remove all of the layer of sacrificial material between the first and second wiring lines.

4. The method of claim 1, wherein the layer of capping material is formed by providing a layer of liquid over the first and second wiring lines which is cured to form a solid oxide layer.

5. The method of claim 4, wherein the liquid is HSQ.

6. The method of claim 1, wherein the layer of capping material is formed by providing a liquid over the first and second wiring lines in a spin on process.

7. The method of claim 6, wherein the capping material within the liquid is solidified to provide the layer of capping material.

8. The method of claim 6, wherein the liquid comprises a polymeric material.

9. The method of claim 7, wherein the liquid comprises oxygen.

10. The method of claim 1, wherein the capping layer covers the upper surfaces of the first and second wiring lines and wherein the capping layer is planarized.

11. The method of claim 1, wherein the pattern of wiring lines is provided by:

patterning the layer of sacrificial material to define trenches;

providing metal to fill the trenches and over the layer of sacrificial material; and removing excess metal to define the pattern of wiring lines within the layer of sacrificial material.

12. The method of claim 11, wherein the step of removing excess metal is accomplished using chemical mechanical polishing.

13. A method of forming an integrated circuit device, the method comprising:

providing a pattern of wiring lines over an insulating layer, a first wiring laterally separated from a second wiring line by a layer of sacrificial material;

removing a portion of the layer of sacrificial material to recess an upper surface of the layer of sacrificial material below upper surfaces of the first and second wiring lines;

providing a layer of nonporous capping material over the first and second wiring lines and over the recessed upper surface of the layer of sacrificial material;

performing a consumption reaction through the layer of capping material to consume at least a further portion of the layer of sacrificial material, leaving an air dielectric between the first and second wiring lines bounded on an upper surface by the capping layer;

providing a layer of etch stop material over the layer of capping material after the consumption reaction, the etch stop material having a different composition than the capping material;

providing an intermetal dielectric layer over the layer of etch stop material, the intermetal dielectric layer having a different composition than the etch stop material; and forming a via by etching through the intermetal dielectric layer, stopping on the layer of etch stop material, etching through the layer of etch stop material and etching through the layer of capping material.

14. The method of claim 13, wherein the step of etching through the layer of capping material clears a surface of the first wiring line but does not etch through an entire thickness of the layer of capping material.

15. The method of claim 14, wherein the via is positioned so that most of the via is disposed over the first wiring line but a portion of the via is not disposed over the first wiring line.

16. The method of claim 14, wherein the step of etching through the intermetal dielectric layer proceeds through a first stage etching process and a second stage etching process, the first stage etching process has a higher etching speed and less etching selectivity than those of the second stage etching process.

17. The method of claim 13, wherein the capping material is an oxide and the etch stop material is a nitride.

18. The method of claim 17, wherein the intermetal dielectric layer comprises an oxide.

19. A method of forming an integrated circuit device, the method comprising:

providing a pattern of wiring lines over an insulating layer, individual wiring lines laterally separated by a sacrificial material;

removing a portion of the sacrificial material to recess an upper surface of the sacrificial material below upper surfaces of the wiring lines;

providing a capping layer over the pattern of wiring lines over an upper surface of the sacrificial material, wherein the capping layer is nonporous;

performing a consumption reaction through the capping layer to consume at least a portion of the sacrificial material, leaving an air dielectric in place of consumed sacrificial material;

providing an etch stop layer over the capping layer after the consumption reaction;

providing an intermetal dielectric layer over the etch stop layer, the intermetal dielectric layer having a different composition than the etch stop layer; and forming a via by etching through the intermetal dielectric layer, stopping on the etch stop layer, etching through the etch stop layer and etching through the capping layer.

20. The method of claim 19, wherein the etch stop layer has a different composition than the capping layer.

21. The method of claim 19, wherein the step of etching through the capping layer clears a surface of a wiring line but does not etch through an entire thickness of the capping layer.

22. The method of claim 19, wherein the capping layer is formed by providing a layer of liquid over the first and second wiring lines which is processed to form a solid layer comprising an oxide.

23. The method of claim 22, wherein the liquid is HSQ.

24. The method of claim 19, wherein the step of performing the consumption reaction comprises performing an oxidation process.

25. The method of claim 24, wherein the sacrificial material comprises carbon.

26. The method of claim 25, wherein the sacrificial material consists essentially of carbon.

27. The method of claim 24, wherein the consumption reaction continues to remove all of the sacrificial material beneath the capping layer.

28. The method of claim 19, further comprising the step, performed prior to forming the etch stop layer, of removing a portion of the sacrificial material to recess an upper surface of the sacrificial material below upper surfaces of the wiring lines.

29. The method of claim 28, wherein the sacrificial material is carbon, the capping layer is an oxide, and the etch stop layer is a nitride.

30. The method of claim 19, wherein the via is filled with a metal plug.

31. The method of claim 30, wherein the metal plug connects a first level wiring line to a second level wiring line.

32. The method of claim 31, wherein the metal plug comprises tungsten.

33. The method of claim 19, wherein the step of forming the layer of capping material comprises providing a liquid over the first and second wiring lines in a spin on process.

34. The method of claim 19, wherein the step of forming the layer of capping material comprises providing a liquid over the first and second wiring lines and wherein the capping material is solidified to provide the layer of capping material.

35. The method of claim 33, wherein the liquid comprises a polymeric material.

36. The method of claim 34, wherein the liquid comprises oxygen.

37. The method of claim 1, wherein the air dielectric comprises an air gap.

38. The method of claim 13, wherein said step of forming the via includes etching the layer of etch stop material without exposing the layer of capping material.

39. The method of claim 13, wherein the air dielectric comprises an air gap.

40. The method of claim 19, wherein in said step of forming the via includes etching the layer of etch stop material without exposing the layer of capping material.

41. The method of claim 19, wherein the air dielectric comprises an air gap.

42. The method of claim 19, wherein the step of providing a capping layer includes providing a nonporous oxide capping layer over the pattern of wiring lines over an upper surface of the sacrificial material.

* * * * *